United States Patent
Huang et al.

(10) Patent No.: US 10,134,794 B2
(45) Date of Patent: Nov. 20, 2018

(54) IMAGE SENSOR CHIP SIDEWALL INTERCONNECTION

(71) Applicant: Taiwan Semiconductor Manufacturing Co., Ltd., Hsin-Chu (TW)

(72) Inventors: Kuo-Chin Huang, Yilan (TW); Pao-Tung Chen, Tainan Hsien (TW); Wei-Chieh Chiang, Yuanlin Township (TW); Kazuaki Hashimoto, Zhubei (TW); Jen-Cheng Liu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 16 days.

(21) Appl. No.: 15/487,473

(22) Filed: Apr. 14, 2017

(65) Prior Publication Data
US 2017/0221952 A1    Aug. 3, 2017

Related U.S. Application Data

(63) Continuation of application No. 14/564,231, filed on Dec. 9, 2014, now Pat. No. 9,634,053.

(51) Int. Cl.
*H01L 27/146* (2006.01)

(52) U.S. Cl.
CPC .... *H01L 27/14636* (2013.01); *H01L 27/1469* (2013.01); *H01L 27/14618* (2013.01); *H01L 27/14621* (2013.01); *H01L 27/14627* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 5,684,677 A | 11/1997 | Uchida et al. |
| 5,936,846 A | 8/1999 | Jairazbhoy et al. |
| 6,002,163 A | 12/1999 | Wojnarowski |
| 6,406,938 B2 | 6/2002 | Rodenbeck et al. |
| 6,693,358 B2 | 2/2004 | Yamada et al. |
| 6,756,666 B2 | 6/2004 | Hosomi |
| 6,800,943 B2 | 10/2004 | Adachi |
| 7,180,168 B2 | 2/2007 | Imai |
| 7,227,236 B1 | 6/2007 | Lee et al. |
| 7,271,466 B2 | 9/2007 | Noma et al. |

(Continued)

OTHER PUBLICATIONS

Sque, Stephen. "High-Voltage GaN-HEMT Devices, Simulation and Modelling" NXP Semiconductors ESSDERC Tutorial. Sep. 16, 2013.

(Continued)

*Primary Examiner* — Andres Munoz
(74) *Attorney, Agent, or Firm* — Eschweiler & Potashnik, LLC

(57) ABSTRACT

An image sensor chip having a sidewall interconnect structure to bond and/or electrically couple the image sensor chip to a package substrate is provided. The image sensor chip includes a substrate supporting an integrated circuit (IC) configured to sense incident light. The sidewall interconnect structure is arranged along a sidewall of the substrate and electrically coupled with the IC. A method for manufacturing the image sensor chip and an image sensor package including the image sensor chip are also provided.

20 Claims, 15 Drawing Sheets

(56) References Cited

U.S. PATENT DOCUMENTS

| | | | |
|---|---|---|---|
| 7,510,902 B2 | 3/2009 | Kang | |
| 7,582,512 B2 | 9/2009 | Jobetto | |
| 7,663,222 B2 | 2/2010 | Lohinger et al. | |
| 8,309,398 B2 | 11/2012 | Liu et al. | |
| 8,344,471 B2* | 1/2013 | Tseng | H01L 24/05 257/459 |
| 8,513,756 B2* | 8/2013 | Suzuki | H01L 27/14618 257/432 |
| 8,686,526 B2 | 4/2014 | Kitagawa et al. | |
| 8,697,473 B2 | 4/2014 | Borthakur et al. | |
| 8,729,712 B2* | 5/2014 | Qian | H01L 27/14636 257/459 |
| 8,791,541 B2* | 7/2014 | Huang | H01L 21/6835 257/292 |
| 9,153,490 B2* | 10/2015 | Mitsuhashi | H01L 27/14627 |
| 9,231,012 B2* | 1/2016 | Weng | H01L 27/14618 |
| 9,484,385 B2* | 11/2016 | Weng | H01L 27/14618 |
| 9,691,809 B2* | 6/2017 | Her | H01L 27/1462 |
| 9,768,221 B2* | 9/2017 | Wu | H01L 27/1464 |
| 9,773,829 B2* | 9/2017 | Zheng | H01L 27/14636 |
| 2004/0016983 A1 | 1/2004 | Misawa | |
| 2004/0155355 A1 | 8/2004 | Hanaoka et al. | |
| 2005/0024752 A1 | 2/2005 | Webster | |
| 2005/0077458 A1 | 4/2005 | Ma et al. | |
| 2006/0146233 A1 | 7/2006 | Park | |
| 2008/0164553 A1 | 7/2008 | Lin et al. | |
| 2009/0032893 A1 | 2/2009 | Weng et al. | |
| 2009/0039455 A1 | 2/2009 | Chien et al. | |
| 2009/0134483 A1 | 5/2009 | Weng et al. | |
| 2009/0146148 A1* | 6/2009 | Pyo | H01L 27/14632 257/59 |
| 2010/0090304 A1 | 4/2010 | Liu et al. | |
| 2010/0164036 A1* | 7/2010 | Kim | H01L 27/1463 257/432 |
| 2010/0200898 A1* | 8/2010 | Lin | H01L 27/14618 257/294 |
| 2010/0244173 A1* | 9/2010 | Wang | H01L 27/14623 257/435 |
| 2012/0205769 A1* | 8/2012 | Tsai | H01L 27/1464 257/460 |
| 2013/0020700 A1* | 1/2013 | Liu | H01L 23/16 257/737 |
| 2013/0113065 A1* | 5/2013 | Qian | H01L 27/14636 257/437 |
| 2013/0307103 A1* | 11/2013 | Lin | H01L 27/14621 257/432 |
| 2015/0311247 A1* | 10/2015 | Chen | H01L 27/14698 257/432 |

OTHER PUBLICATIONS

Non-Final Office Action dated May 5, 2016 for U.S. Appl. No. 14/564,231.

Final Office Action dated Sep. 28, 2016 for U.S. Appl. No. 14/564,231.

Notice of Allowance dated Dec. 13, 2016 for U.S. Appl. No. 14/564,231.

* cited by examiner

IMAGE SENSOR CHIP SIDEWALL INTERCONNECTION

REFERENCE TO RELATED APPLICATION

This application is a Continuation of U.S. application Ser. No. 14/564,231, filed on Dec. 9, 2014, the contents of which are hereby incorporated by reference in their entirety.

BACKGROUND

Digital cameras and optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. Image sensors often manifest as charge-coupled devices (CCDs), complementary metal oxide semiconductor (CMOS) devices, or back side illuminated (BSI) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
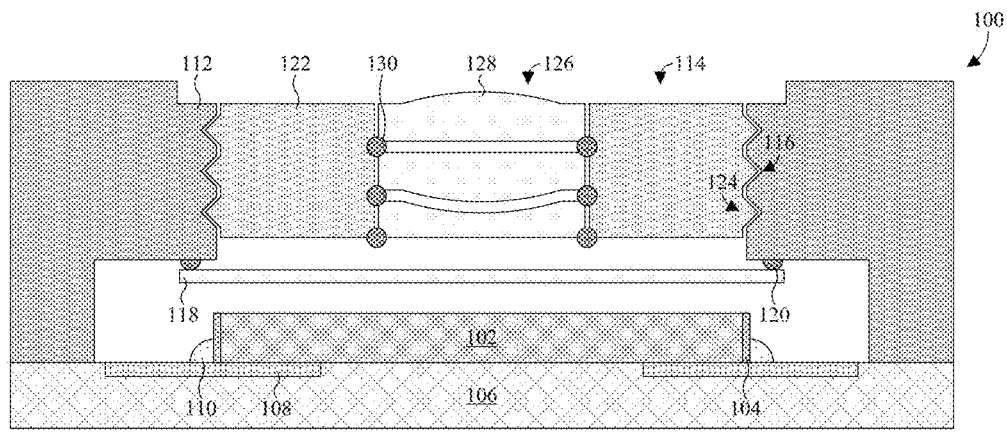
FIG. 1 illustrates a cross-sectional view of some embodiments of an image sensor package having an image sensor chip with a sidewall interconnect structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Image sensors are typically manufactured in bulk on bulk substrates or wafers. The die to which the image sensors correspond are then separated or singulated to form chips, which are typically packaged for use. Packaging provides protection against impact and corrosion, contacts to connect image sensor chips to external devices, and heat dissipation. Packaging includes bonding an image sensor chip over a package substrate and electrically coupling the image sensor chip to the package substrate. Further, a housing structure is formed over the image sensor chip to encapsulate the image sensor chip with the package substrate. The completed package can then bonded and/or electrically coupled to a flexible printed circuit (FPC) and/or to an external device.

According to some methods for packaging image sensor chips, an image sensor chip is bonded over a ball grid array (BGA). The BGA includes a package substrate and an array of solder balls arranged on an opposite side of the package substrate as the image sensor chip. The image sensor chip is then electrically coupled to the array of solder balls through the package substrate by wire bonding the image sensor chip to the package substrate. Wire bonding packaging methods are cheap and easy to employ. However, wire bonding packaging methods also introduce high resistance between the image sensor chip and the package substrate. This, in turn, reduces performance between the image sensor chip and external devices by increasing the resistance. Further, wire bonding packaging methods result in a larger package size.

According to other methods for packaging image sensor chips, gold studs or bumps are formed over bond pads of an image sensor chip. The image sensor chip is then flip chip/gold stud bonded (GSB) to a package substrate through the gold studs or bumps. The bonding electrically couples the image sensor chip, through the gold studs and the package substrate, to an array of solder balls on a bottom of the package substrate. Flip chip/GSB packaging methods yield smaller package size (relative to wire bonding) and lower resistance between the image sensor chip and the package substrate. The latter yields improved performance between the image sensor chip and external devices by reducing the resistance. However, flip chip/GSB packaging methods are also complex, require a special chip design, and have low yields.

According to yet other methods for packaging image sensor chips, an image sensor chip is formed with through silicon vias (TSVs) connecting to bond pads on a back side of the image sensor chip. Gold studs or bumps are then formed over the bond pads, and the image sensor is bonded to a BGA through the gold studs or bumps. The BGA includes a package substrate and an array of solder balls arranged on an opposite side of the package substrate as image sensor chip. The bonding electrically couples the image sensor chip, through the gold studs and the package substrate, to the array of solder balls. TSV/GSB packaging methods yield chip-scale packages and lower resistance connections between the image sensor chip and external devices. However, TSV/GSB packaging methods are costly, require a special chip design, and are limited to high-end hardware. Further, the height of the package is limited by the height of the solder balls.

In view of the foregoing, the present disclosure is directed to an improved method for packaging image sensor chips. The improved method employs a sidewall interconnection between an image sensor chip and a package substrate to bond and/or electrically couple the image sensor chip to the package substrate. In contrast with known packaging methods, the package substrate can be an FPC or a component of an external device. Hence, the packaging method of the present disclosure allows the image sensor chip to be directly mounted to the FPC or a component of the external device. The present disclosure is also directed to an improved image sensor package resulting from performance of the improved method. The improved image sensor package employs a sidewall interconnect structure to bond and/or electrically couple the image sensor chip to the package substrate.

The improved method and the improved package are compatible with back side illuminated (BSI) technology, and assembly of the image sensor package is advantageously simplified with a low entry level. Further, low resistance and high performance are advantageously achieved between the image sensor chip and the FPC or external device, and a BGA or flip chip substrate is not needed. Even more, size and height are advantageously reduced to, for example, chip-scale (i.e., no larger than 1.2 times the size of the chip).

With reference to FIG. 1, a cross-sectional view 100 of an image sensor package according to some embodiments is provided. The image sensor package includes an image sensor chip 102 with conductive sidewall structures 104 spaced around the periphery of the image sensor chip 102 on the sidewalls of the image sensor chip 102. The conductive sidewall structures 104 extend along the sidewalls for bonding and/or electrically coupling the image sensor chip 102 to an external device and/or substrate. In some embodiments, the image sensor chip 102 is one of a charge-coupled device (CCD), a complementary metal oxide semiconductor (CMOS) device, or a BSI device.

A package substrate 106 having a larger footprint than the image sensor chip 102 is arranged below the image sensor chip 102. The footprint of the package substrate 106 is, for example, less than 1.2× the width and 1.2× the length, of the image sensor chip 102, for a chip-scale package. In some embodiments, the package substrate 106 is a bulk semiconductor substrate or a silicon-on-insulator (SOI) substrate. In other embodiments, the package substrate 106 is a BGA substrate, another chip or integrated circuit, or a FPC.

Package bond pads 108 are arranged below the image sensor chip 102 and over and/or within the package substrate 106. The package bond pads 108 extend laterally perpendicular to the conductive sidewall structures 104 and are electrically coupled through the package substrate 106 to an external device and/or external bond pads (not shown). For example, the package bond pads 108 are electrically coupled through the package substrate 106 to solder balls (not shown) arranged on an opposite side of the package substrate 106 as the image sensor chip 102. As another example, the package bond pads 108 are electrically coupled through the package substrate 106 to an electronic circuit (not shown) arranged within the package substrate 106.

Bonding and/or electrical coupling (B/EC) structures 110 are arranged along sidewalls of the image sensor chip 102 between corresponding package bond pads 108 and corresponding conductive sidewall structures 104 to bond and/or electrically couple the image sensor chip 102 to the package substrate 106. There is typically a one-to-one correspondence between the B/EC structures 110 and the conductive sidewall structures 104, and between the B/EC structures 110 and the package bond pads 108. Further, the B/EC structures 110 are typically solder balls, but other types of bonding structures are amenable.

The bonding and/or electrical coupling is advantageously performed at the sidewalls of the image sensor chip 102 through the conductive sidewall structures 104. The image sensor chip 102 can directly abut the package substrate 106, and the image sensor chip 102 can directly abut the package bond pads 108, without the B/EC structures 110 and/or any other material intervening. Further, the size and the height of the image sensor package can be reduced since intervening material is not needed and the bonding and/or electrical coupling can be achieved with small margins between the sidewalls of the image sensor chip 102 and the package substrate 106. For example, the size and the height of the image sensor package can be reduced to chip-scale (i.e., no larger than 1.2 times the size of the chip). Even more, assembly of the image sensor package can be simplified since minimal changes are needed to the layout of the image sensor chip. The bonding and/or electrical coupling is compatible with BSI technology and achieves a low resistance, high performance electrical connection between the image sensor chip 102 and the package substrate 106.

A first housing structure 112 is arranged on the package substrate 106 around the periphery of the image sensor chip 102. The first housing structure 112 extends vertically above the image sensor chip 102 and laterally inward over the image sensor chip 102, to define a first aperture 114, typically circular in shape, over the image sensor chip 102 between the sidewall of the lateral extension. In some embodiments, the sidewall of the lateral extension is lined with first screw threads 116. A transparent plate 118, such as a glass plate, is bonded to a bottom surface of the lateral extension by a first bonding structure 120 and extends across the first aperture 114 over the image sensor chip 102.

A second housing structure 122 is arranged, typically removably arranged, in the first aperture 114. In some embodiments, the sidewall of the second housing structure 122 is lined with second screw threads 124 configured to mate with the first screw threads 116. The second housing structure 122 includes a second aperture 126, typically circular in shape, over the image sensor chip 102. Within the second aperture 126, one or more lenses 128 are arranged. The lenses 128 are designed to focus light on to the image sensor chip 102 and secured to the second housing structure 122 by a second bonding structure 130.

In other embodiments, the image sensor chip 102 can be replaced with another type of chip having a sidewall interconnect structure. Other types of chips include memory chips (e.g., flash memory chips), radio frequency (RF) chips, and so on.

Figure 2:
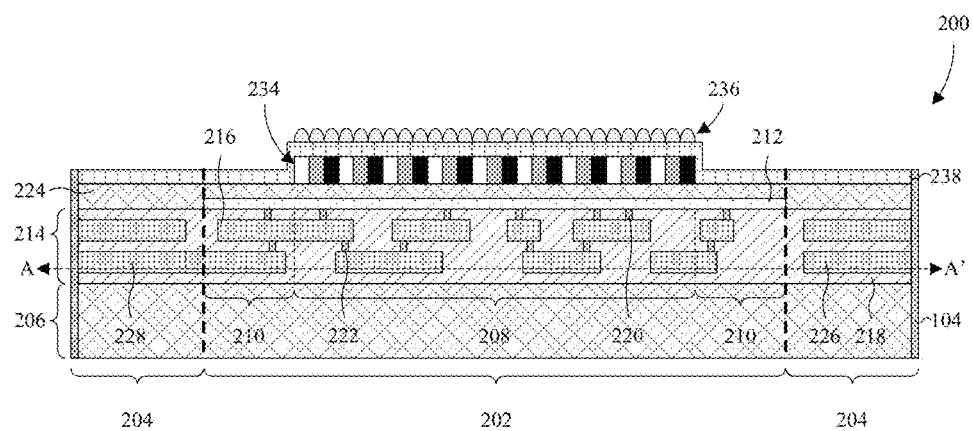
FIG. 2 illustrates a cross-sectional view of some embodiments of an image sensor chip according to FIG. 1.
Figure 3:
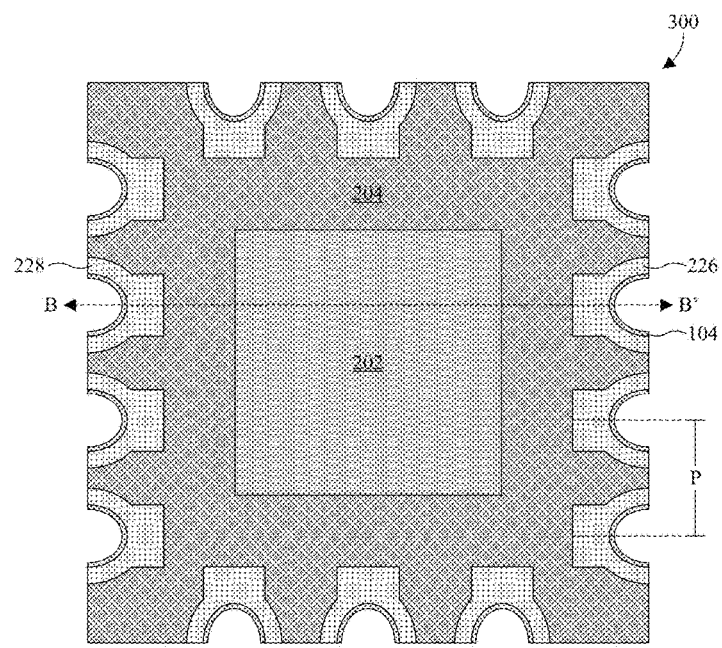
FIG. 3 illustrates a top view of some embodiments of an image sensor chip according to FIG. 1.

With reference to FIGS. 2 & 3, cross-sectional and top views 200, 300 of an image sensor chip according to some embodiments are provided. FIG. 3 is taken along line A-A' of FIG. 2, and FIG. 2 is taken along line B-B' of FIG. 3. The image sensor chip is suitable for use as the image sensor chip 102 of FIG. 1. The image sensor chip includes an integrated circuit (IC) region 202 having an IC circuit for image sensing and an edge region 204 surrounding the IC region 202 for external connection to a package substrate and/or external device. As described in greater detail hereafter, the edge region 204 employs sidewall interconnection to bond and/or electrically couple the IC region 202 to the package substrate and/or the external device. Typically, the image sensor chip is one of a CCD device, a CMOS device, or a BSI device.

A first substrate 206 supports an array 208 of pixel sensors, such as active pixel sensors, and a supporting logic circuit 210 (collectively the IC circuit) within the IC region 202. The first substrate 206 is, for example, a bulk substrate of silicon, germanium, or group III and group V elements. Alternatively, the first substrate 206 is, for example, a SOI substrate. The pixel sensors are unit devices for the conversion of an optical image into digital data and correspond to the smallest areas to which light incident on the pixel sensor array 208 can be localized therein. The supporting logic circuit 210 supports readout of the pixel sensor array 208. Typically, the supporting logic circuit 210 is arranged around the periphery of the pixel sensor array 208.

A device layer 212 and a back-end-of-line (BEOL) metallization stack 214 are arranged over and/or with the first substrate 206 to collectively form the pixel sensor array 208 and the supporting logic circuit 210. The device layer 212 includes electronic devices, such as transistors, resistors, capacitors, photodiodes, etc., of the image sensor chip. The device layer 212 typically includes photodetectors, such as photodiodes, for the pixel sensor array 208 and transistors for the supporting logic circuit 210. The BEOL metallization stack 214 interconnects the electronic devices by one or more metallization layers 216 arranged within an interlayer dielectric (ILD) layer 218. One or more contacts 220 electrically couple the device layer 212 to the metallization layers 216, and one or more vias 222 electrically couple the metallization layers 216 to each other.

In some embodiments, as illustrated, the device layer 212 is arranged over the BEOL metallization stack 214 on a bottom surface of and/or within a second substrate 224. In other embodiments, the second substrate 224 is omitted and the device layer 212 is arranged below the BEOL metallization stack 214 on a top surface of and/or within the first substrate 206. Typically, the second substrate 224 is employed where the image sensor chip is a BSI device, such that the first substrate 206 serves as a carrier substrate and the second substrate 224 serves as an image sensor substrate. The second substrate 224 is, for example, a bulk substrate of silicon, germanium, or group III and group V elements. Alternatively, the second substrate 224 is, for example, a SOI substrate.

Image sensor bond pads 226, 228 are arranged within the ILD layer 218 and the edge region 204 along sidewalls of the image sensor chip. The image sensor bond pads 226, 228 are electrically coupled to the IC region 202 through the BEOL metallization stack 214. The image sensor bond pads 226, 228 include one or more external bond pads 226 to electrically couple the device layer 212 to external devices for normal use and one or more testing bond pads 228 for wafer acceptance testing (WAT) or circuit probing. Advantageously, the external bond pads 226 and the testing bond pads 228 are separated. In some embodiments, as illustrated in FIG. 3, the image sensor bond pads 226, 228 have a concave footprint laterally arcing into the image sensor chip. Advantageously, the concave footprint and the use of a sidewall interconnection allows pitch between the image sensor bond pads 226, 228 to be reduced since the sidewall surface area for bonding and electrical coupling is increased. For example, the pitch P can be scaled down to about 80 micrometers.

Conductive sidewall structures 104 are arranged around the periphery of the image sensor chip, abutting sidewalls of the image sensor bond pads 226, 228, to define sidewalls of the image sensor chip. In some embodiments, the conductive sidewall structures 104 have a concave footprint laterally arcing into the image sensor chip. The conductive sidewall structures 104 allow the image sensor chip to be bonded with a package substrate at the sidewalls of the image sensor chip. Further, the conductive sidewall structures 104 electrically couple with the IC region 202 through the BEOL metallization stack 214 to allow the image sensor chip to be electrically coupled with a package substrate at the sidewalls of the image sensor chip. Advantageously, such electrical coupling allows a low resistance, high performance connection between the image sensor chip and external devices connected to the image sensor chip through the package substrate. Further, such bonding and/or electrical coupling advantageously allow easy packaging and a reduced profile and footprint.

An inner seal ring (not shown) and an outer seal ring (not shown) are arranged in the edge region around the IC region. The inner seal ring is arranged within the outer seal ring along the periphery of the IC region, and the outer seal ring is arranged along sidewalls of the image sensor chip. The inner and outer seal rings serve to protect the IC region from contaminants (e.g., sodium) from mechanical stress induced by a die saw or other processes employed to separate multiple die formed on a semiconductor wafer into individual die. The inner and out seal rings can take on any thickness. However, in some embodiments, the inner seal ring and/or the outer seal ring are 10 micrometers thick.

A color filter array 234 is arranged over the pixel sensor array 208 and a micro lens array 236 is arranged over the color filter array 234. The color filter array 234 is a mosaic of tiny color filters placed to assign colors to the pixel sensors, because pixel sensors are unable to distinguish between light of different colors. For example, the color filter array 234 is a Bayer filter. A Bayer filter includes a mosaic of red, green and blue filters arranged in a filter pattern of 50% green, 25% red, and 25% blue. Such an arrangement of filters is advantageous because red, green, and blue can be mixed in different combinations to produce most of the colors visible to the human eye. The micro lens array 236 focuses light through a color filter array 234 to the pixel sensor array 208.

A flatness layer 238 is arranged between the color filter array 234 and the micro lens array 236. Further, in some embodiments, the flatness layer 238 is arranged over a top surface of the second substrate 224 and/or the BEOL metallization stack 214. The flatness layer 238 smooths the top surface of the color filter array 234 to reduce surface roughness of the color filter array 234 and to reduce topographical differences between micro lenses of the micro lens array 236. The flatness layer 238 is transparent and includes, for example, silicon oxide or aluminum oxide.

Figure 4:
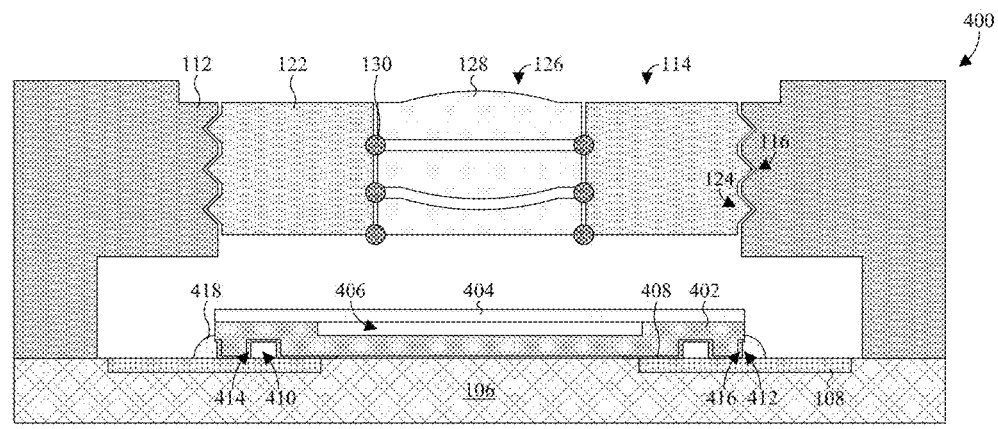
FIG. 4 illustrates a cross-sectional view of alternative embodiments of an image sensor package having an image sensor chip with a sidewall interconnect structure.

With reference to FIG. 4, a cross-sectional view 400 of an image sensor package according to alternative embodiments is provided. The image sensor package includes an image sensor chip 402 with a transparent plate 404, such as a glass plate, arranged along the top of the image sensor chip 402 to define a cavity 406 within the image sensor chip 402. The cavity is suitably arranged over a sensing region of the image sensor chip 402. In some embodiments, the image sensor chip 402 is one of a CCD, a CMOS device, or a BSI device.

A conductive layer 408 of the image sensor chip 402 is arranged along a bottom of the image sensor chip 402. The conductive layer 408 lines TSV holes 410 in the bottom of the image sensor chip 402 and lateral recesses 412 in the sidewalls of the image sensor chip 402. Regions of the conductive layer 408 lining the TSV holes 410 define TSVs 414, and regions of the conductive layer 408 lining the lateral recesses 412 define conductive sidewall structures 416. The conductive sidewall structures 416 are spaced around the periphery of the image sensor chip 402 on the sidewalls of the image sensor chip 402 to bond the image sensor chip 402 to an external device and/or substrate, and/or to electrically couple the image sensor chip 402 to the external device and/or substrate through corresponding TSVs 414. Typically, there is a one-to-one correspondence between the conductive sidewall structures 416 and the vias 414.

A package substrate 106 having a larger footprint than the image sensor chip 402 is arranged below the image sensor chip 402, and package bond pads 108 are arranged below the image sensor chip 402 over and/or within the package substrate 106. The footprint of the package substrate 106 is, for example, less than 1.2× the width and 1.2× the length, of the image sensor chip 402, for a chip-scale package. The package bond pads 108 extend laterally perpendicular to the conductive sidewall structures 416 and are electrically coupled through the package substrate 106 to an external device and/or external bond pads (not shown).

Bonding and/or electrical coupling (B/EC) structures 418 are arranged along sidewalls of the image sensor chip 402 between corresponding package bond pads 108 and corresponding conductive sidewall structures 416 to bond and/or electrically couple the image sensor chip 402 to the package substrate 106. There is typically a one-to-one correspondence between the B/EC structures 418 and the conductive sidewall structures 104, and between the B/EC structures 418 and the package bond pads 108. Further, the B/EC structures 418 are typically solder balls, but other types of bonding structures are amenable.

The bonding and/or electrical coupling is advantageously performed at the sidewalls of the image sensor chip 402 through the conductive sidewall structures 416. The image sensor chip 402 can directly abut the package substrate 106, and the image sensor chip 402 can directly abut the package bond pads 108, without the B/EC structures 418 and/or any other material intervening. Further, the size and the height of the image sensor package can be reduced. Even more, assembly of the image sensor package can be simplified. The bonding and/or electrical coupling is compatible with BSI technology and achieves a low resistance, high performance electrical connection between the image sensor chip 402 and the package substrate 106.

A first housing structure 112 is arranged on the package substrate 106 around the periphery of the image sensor chip 402. The first housing structure 112 extends vertically above the image sensor chip 402 and laterally inward over the image sensor chip 402, to define a first aperture 114, typically circular in shape, over the image sensor chip 102 between the sidewall of the lateral extension. In some embodiments, the sidewall of the lateral extension is lined with first screw threads 116.

A second housing structure 122 is arranged, typically removably arranged, in the first aperture 114. In some embodiments, the sidewall of the second housing structure 122 is lined with second screw threads 124 configured to mate with the first screw threads 116. The second housing structure 122 includes a second aperture 126, typically circular in shape, over the image sensor chip 402. Within the second aperture 126, one or more lenses 128 are arranged. The lenses 128 are designed to focus light on to the image sensor chip 402 and secured to the second housing structure 122 by a bonding structure 130.

Figure 5:
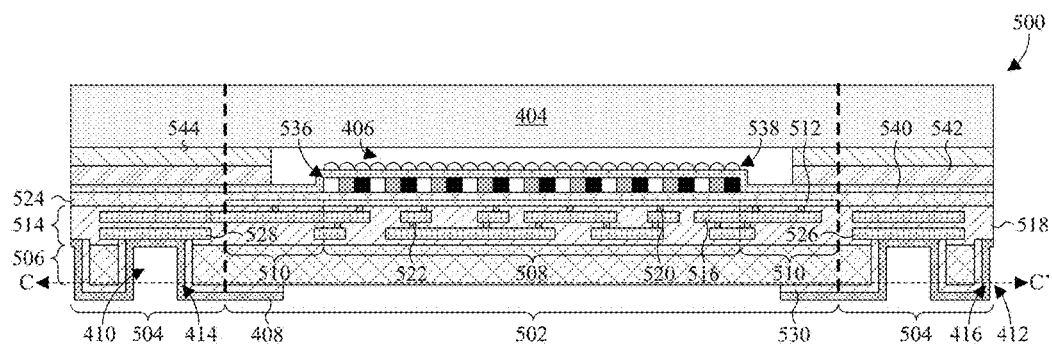
FIG. 5 illustrates a cross-sectional view of some embodiments of an image sensor chip according to FIG. 4.
Figure 6:
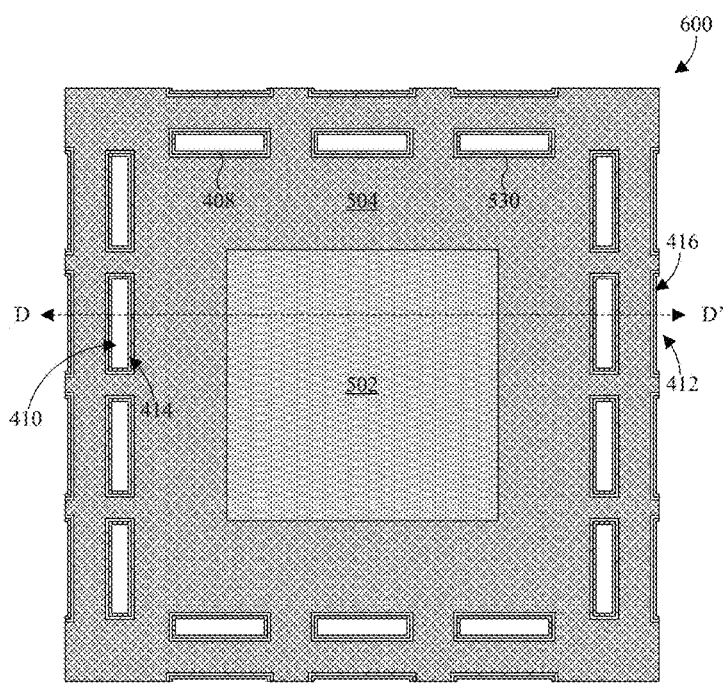
FIG. 6 illustrates a top view of some embodiments of an image sensor chip according to FIG. 4.

With reference to FIGS. 5 & 6, cross-sectional and top views 500, 600 of an image sensor chip according to some embodiments are provided. FIG. 6 is taken along line C-C' of FIG. 5, and FIG. 5 is taken along line D-D' of FIG. 6. The image sensor chip is suitable for use as the image sensor chip 402 of FIG. 4. The image sensor chip includes an IC region 502 having an IC circuit for image sensing and an edge region 504 surrounding the IC region 502 for external connection to a package substrate and/or external device. As described in greater detail hereafter, the edge region 504 employs sidewall interconnection to bond and/or electrically couple the IC region 502 to the package substrate and/or the external device. Typically, the image sensor chip is one of a CCD, a CMOS device, or a BSI device.

A first substrate 506 supports an array 508 of pixel sensors and a supporting logic circuit 510 (collectively the IC circuit) within the IC region 502. The first substrate 506 is, for example, a bulk semiconductor substrate of silicon, germanium, or group III and group V elements. Alternatively, the first substrate 506 is, for example, a SOI substrate. The pixel sensors are unit devices for the conversion of an optical image into digital data and correspond to the smallest areas to which light incident on the pixel sensor array 508 can be localized therein. The supporting logic circuit 510 supports readout of the pixel sensor array 508. Typically, the supporting logic circuit 510 is arranged around the periphery of the pixel sensor array 508.

A device layer 512 and a BEOL metallization stack 514 are arranged over and/or within the first substrate 506 to collectively form the pixel sensor array 508 and the supporting logic circuit 510. The device layer 512 includes electronic devices, such as transistors, resistors, capacitors, photodiodes, etc., of the image sensor chip. The BEOL metallization stack 514 interconnects the electronic devices by one or more metallization layers 516 arranged within an ILD layer 518. One or more contacts 520 electrically couple the device layer 512 to the metallization layers 516, and one or more vias 522 electrically couple the metallization layers 516 to each other.

In some embodiments, as illustrated, the device layer 512 is arranged over the BEOL metallization stack 514 on a bottom surface of and/or within a second substrate 524. In other embodiments, the second substrate 524 is omitted and the device layer 512 is arranged below the BEOL metallization stack 514 on a top surface of and/or within the first substrate 506. The second substrate 524 is, for example, a bulk semiconductor substrate of silicon, germanium, or group III and group V elements. Alternatively, the second substrate 524 is, for example, a SOI substrate.

Image sensor bond pads 526, 528 are arranged within the ILD layer 518 and the edge region 504 along sidewalls of the image sensor chip. The image sensor bond pads 526, 528 are electrically coupled to the IC region 502 through the BEOL metallization stack 514. The image sensor bond pads 526, 528 include one or more external bond pads 526 to electrically couple the device layer 512 to external devices for normal use and one or more testing bond pads 528 for WAT or circuit probing.

TSV holes 410 extend through the first substrate 506 to the image sensor bond pads 526, 528, and lateral recesses 412 extend laterally into the sidewall of the first substrate 506 adjacent to corresponding TSV holes 410. The lateral recesses 412 are such that the bottoms of the lateral recesses 412 are open and the ILD layer 518 overhangs the lateral recesses 412. In some embodiments, the TSV holes 410 and the lateral recesses 412 extend partially into the ILD layer 518 and/or there is a one-to-one correspondence between the TSV holes 410 and the lateral recesses 412. A dielectric layer 530 arranged below the first substrate 506 lines the sidewalls of the TSV holes 410 and of the lateral recesses 412, and a conductive layer 408 arranged below the dielectric layer 530 lines the TSV holes 410 and the lateral recesses 412.

Regions of the conductive layer 408 lining the TSV holes 410 define TSVs 414, and regions of the conductive layer 408 lining the lateral recesses 412 define conductive sidewall structures 416. The TSVs 414 electrically couple the conductive sidewall structures 416 to the image sensor bond pads 526, 528 through the first substrate 506. The conductive sidewall structures 416 allow the image sensor chip to be bonded with a package substrate at the sidewalls of the image sensor chip. Further, the conductive sidewall structures 416 allow the image sensor chip to be electrically coupled with a package substrate at the sidewalls of the image sensor chip through the BEOL metallization stack 514 and the TSVs 414. Advantageously, such electrical coupling allows a low resistance, high performance connection between the image sensor chip and external devices connected to the image sensor chip through the package substrate. Further, such bonding and/or electrical coupling advantageously allow easy packaging and a reduced profile and footprint.

An inner seal ring (not shown) and an outer seal ring (not shown) are arranged in the edge region around the IC region. The inner seal ring is arranged within the outer seal ring along the periphery of the IC region, and the outer seal ring is arranged along sidewalls of the image sensor chip. The inner and outer seal rings serve to protect the IC region from contaminants (e.g., sodium) from mechanical stress induced by a die saw or other processes employed to separate multiple die formed on a semiconductor wafer into individual die. The inner and out seal rings can take on any thickness. However, in some embodiments, the inner seal ring and/or the outer seal ring are 10 micrometers thick.

A color filter array 536 is arranged over the pixel sensor array 508 and a micro lens array 538 is arranged over the color filter array 536. The color filter array 536 is a mosaic of tiny color filters placed to assign colors to the pixel sensors, because pixel sensors are unable to distinguish between light of different colors. For example, the color filter array 536 is a Bayer filter. The micro lens array 538 focuses light through a color filter array 536 to the pixel sensor array 508.

A flatness layer 540 is arranged between the color filter array 536 and the micro lens array 538. Further, in some embodiments, the flatness layer 540 is arranged over a top surface of the second substrate 524 and/or the BEOL metallization stack 514. The flatness layer 540 smooths the top surface of the color filter array 536 to reduce surface roughness of the color filter array 536 and to reduce topographical differences between micro lenses of the micro lens array 538. The flatness layer 540 is transparent and includes, for example, silicon oxide or aluminum oxide.

An epoxy layer 542 is arranged over the flatness layer 540 around the color filter and micro lens arrays 536, 538, and a dam layer 544 is arranged over the epoxy layer 542 around the color filter and micro lens arrays 536, 538. The epoxy layer 542 provides a bond between the dam layer 544 and the flatness layer 540, and the dam layer 544 provides spacing between the micro lens array 538 and a transparent plate 404, such as a glass plate, arranged over the micro lens array 538 and the dam layer 544. The transparent plate 404 forms a cavity 406 over the micro lens array 538 between the transparent plate 404, the epoxy layer 542, the dam layer 544, and the flatness layer 540.

Figure 7:
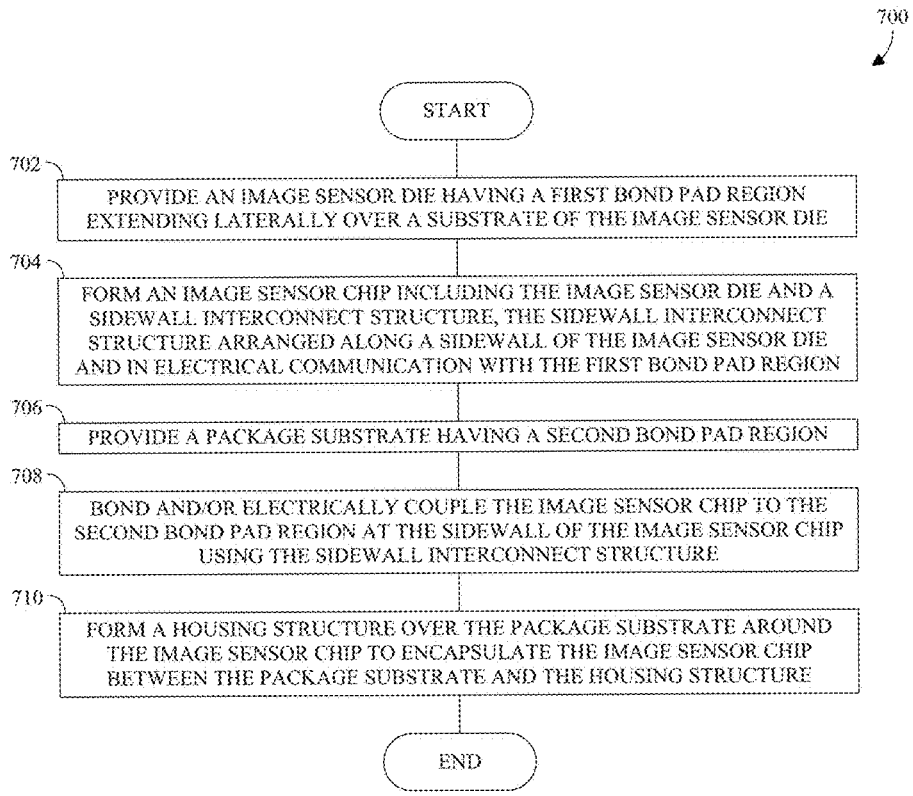
FIG. 7 illustrates a flow chart of some embodiments of a method for manufacturing an image sensor package having an image sensor chip with a sidewall interconnect structure.

With reference to FIG. 7, a flowchart 700 provides some embodiments of a method for manufacturing an image sensor package having an image sensor chip with a sidewall interconnect structure. Examples of the image sensor package are shown in FIGS. 1 and 4.

At 702, an image sensor die having a first bond pad region is provided. The first bond pad region extends laterally over a substrate of the image sensor die.

At 704, an image sensor chip including the image sensor die and a sidewall interconnect structure is formed. The sidewall interconnect structure is arranged along a sidewall of the image sensor die and in electrical communication with the first bond pad region.

At 706, a package substrate having a second bond pad region is provided.

At 708, the image sensor chip is bonded and/or electrically coupled to the second bond pad region at the sidewall of the image sensor chip through the sidewall interconnect structure.

At 710, a housing structure is formed over the package substrate around the image sensor chip to encapsulate the image sensor chip between the package substrate and the housing structure.

Advantageously, by bonding and/or electrically coupling the image sensor chip to the package substrate at the sidewall of the image sensor chip, a low resistance, high performance electrical connection can be formed between the package substrate and the image sensor chip. Further, the size of the package housing can be reduced since bonding and/or electrical coupling can be achieved with a small margin between the sidewall of the package substrate and the image sensor chip, and without a substrate or other material arranged between top and bottom surfaces of the image sensor chip and the package substrate. Moreover, the sidewall interconnect structure can be integrated into the image sensor chip with minimal modifications to the layout of the image sensor chip.

Figure 8:
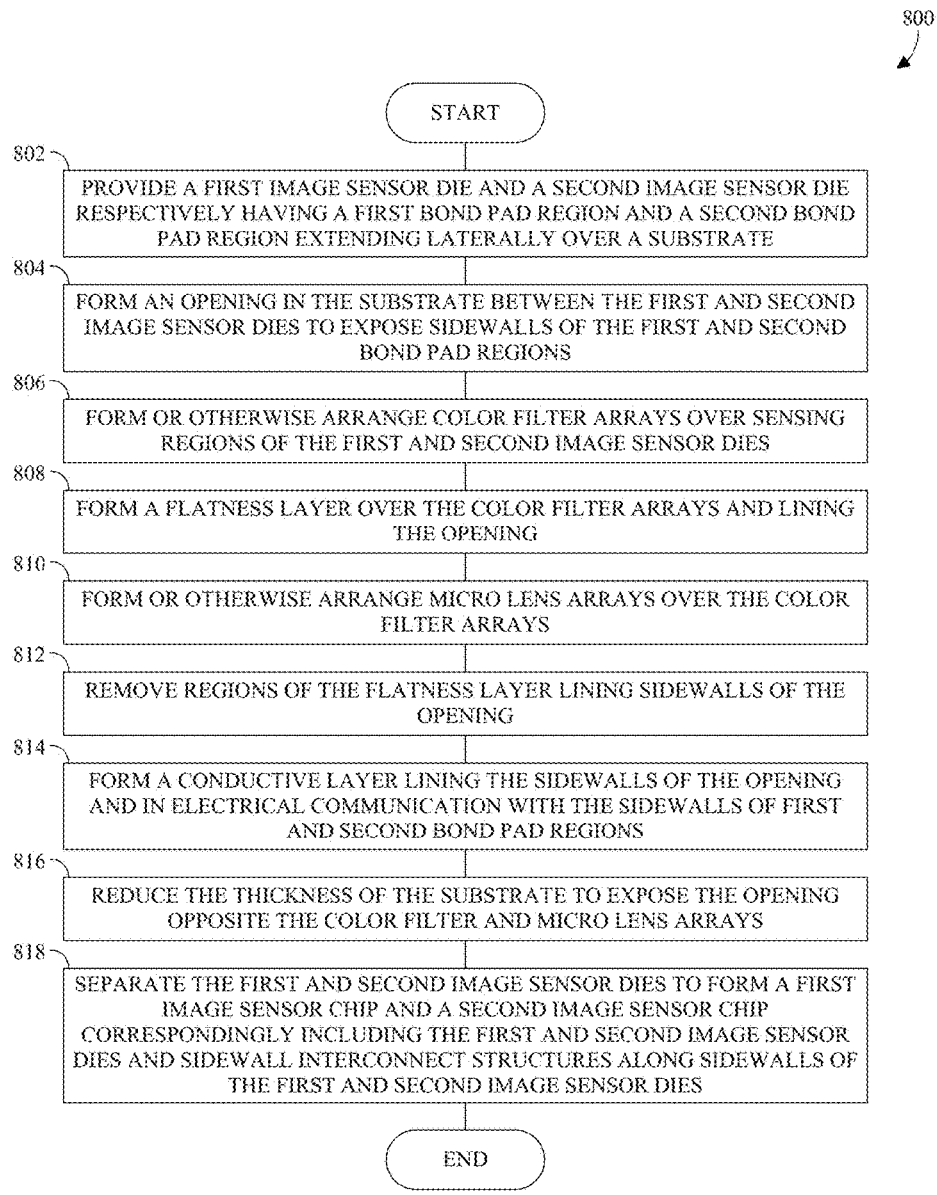
FIG. 8 illustrates a flowchart of some embodiments of a method for manufacturing an image sensor chip having a sidewall interconnect structure according to FIGS. 1-3.

With reference to FIG. 8, a flowchart 800 of some embodiments of a method for manufacturing an image sensor chip having a sidewall interconnect structure. Examples of the image sensor chip are shown in FIGS. 1-3. In some embodiments, the method is employed to carry out Action 704 of FIG. 7.

At 802, a first image sensor die and a second image sensor die are provided. The first and second image sensor die respectively have a first bond pad region and a second bond pad region extending laterally over a substrate.

At 804, an opening is formed in the substrate between the first and second image sensor die to expose sidewalls of the first and second bond pad regions.

At 806, color filter arrays are formed or otherwise arranged over sensing regions of the first and second image sensor die.

At 808, a flatness layer is formed over the color filter arrays and lining the opening.

At 810, micro lens arrays are formed or otherwise arranged over the color filter arrays.

At 812, regions of the flatness layer lining sidewalls of the opening are removed.

At 814, a conductive layer is formed lining the sidewalls of the opening and in electrical communication with the sidewalls of first and second bond pad regions.

At 816, the thickness of the wafer is reduced to expose the opening opposite the color filter and micro lens arrays.

At 818, the first and second image sensor die are separated to form a first image sensor chip and a second image sensor chip respectively including the first and second image sensor die and sidewall interconnect structures along sidewalls of the first and second image sensor die.

Figure 9:
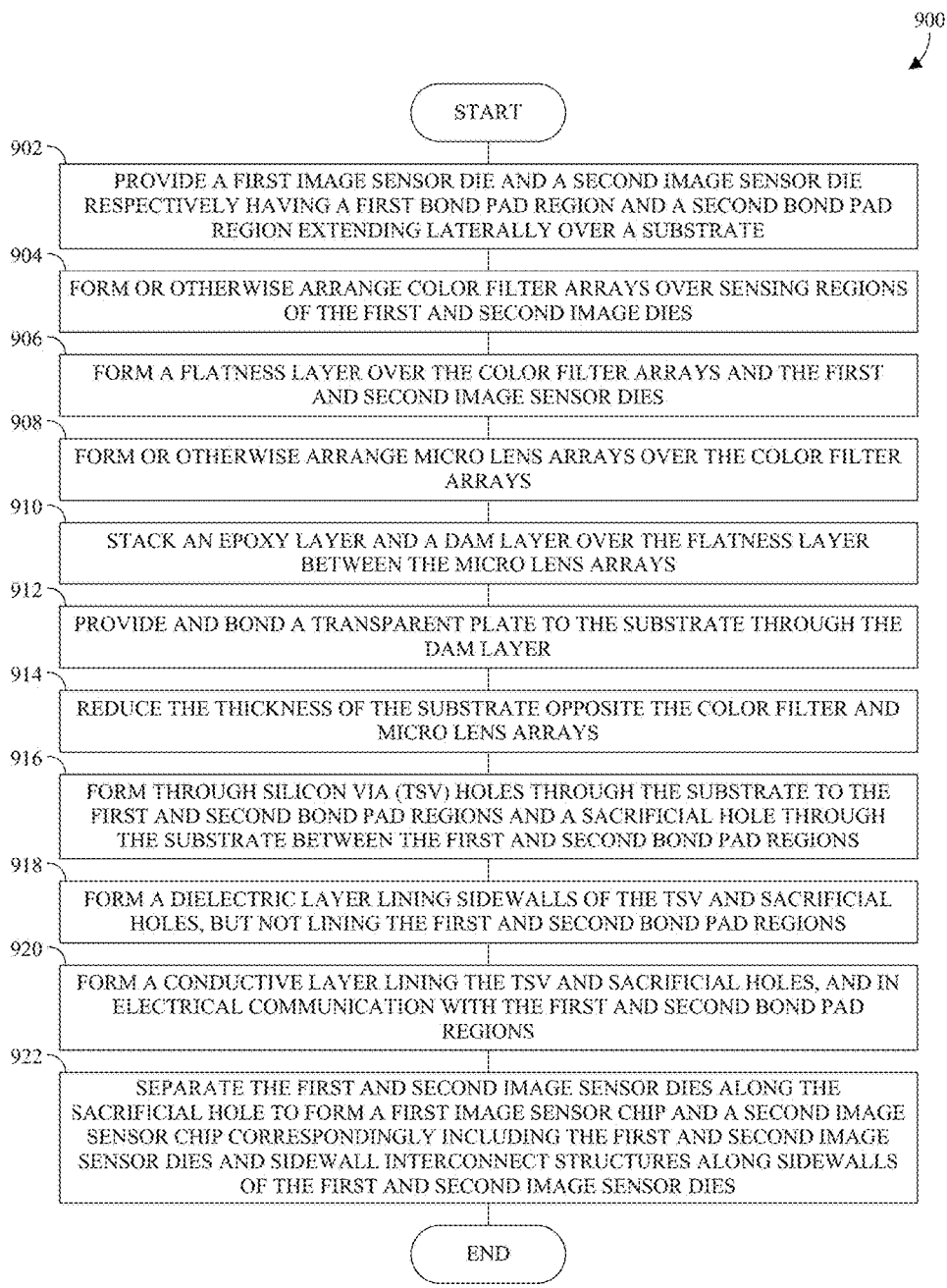
FIG. 9 illustrates a flowchart of some embodiments of a method for manufacturing an image sensor chip having a sidewall interconnect structure according to FIGS. 4-6.

With reference to FIG. 9, a flowchart 900 of some embodiments of a method for manufacturing an image sensor chip having a sidewall interconnect structure. Examples of the image sensor chip are shown in FIGS. 4-6. In some embodiments, the method is employed to carry out 704 of FIG. 7.

At 902, a first image sensor die and a second image sensor die are provided. The first and second image sensor die respectively have a first bond pad region and a second bond pad region extending laterally over a substrate.

At 904, color filter arrays are formed or otherwise arranged over sensing regions of the first and second image die.

At 906, a flatness layer is formed over the color filter arrays and the first and second image sensor die.

At 908, micro lenses are formed or otherwise arranged over the color filter arrays.

At 910, an epoxy layer and a dam layer are stacked over the flatness layer between the micro lens arrays.

At 912, a glass plate is provided and bonded to the substrate through the dam layer.

At 914, the thickness of the substrate is reduced opposite the color filter and micro lens arrays.

At 916, TSV holes are formed through the substrate to the first and second bond pad regions and through the substrate between the first and second bond pad regions.

At 918, a dielectric layer lining sidewalls of the TSV holes, but not lining the first and second bond pad regions, is formed.

At 920, a conductive layer lining the sidewalls of the TSV holes and in electrical communication with the first and second bond pad regions is formed.

At 922, the first and second image sensor die are separated along the sacrificial hole to form a first image sensor chip and a second image sensor chip respectively including the first and second image sensor die and sidewall interconnect structures along sidewalls of the first and second image sensor die.

While the disclosed methods (e.g., the method described by the flowcharts 700, 800, 900) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 10-18, cross-sectional views of some embodiments of an image sensor chip at various stages of manufacture are provided to illustrate the method of FIG. 8. Although FIGS. 10-18 are described in relation to the method, it will be appreciated that the structures disclosed in FIGS. 10-18 are not limited to the method, but instead may stand alone as structures independent of the method. Similarly, although the method is described in relation to FIGS. 10-18, it will be appreciated that the method is not limited to the structures disclosed in FIGS. 10-18, but instead may stand alone independent of the structures disclosed in FIGS. 10-18.

Figure 10:
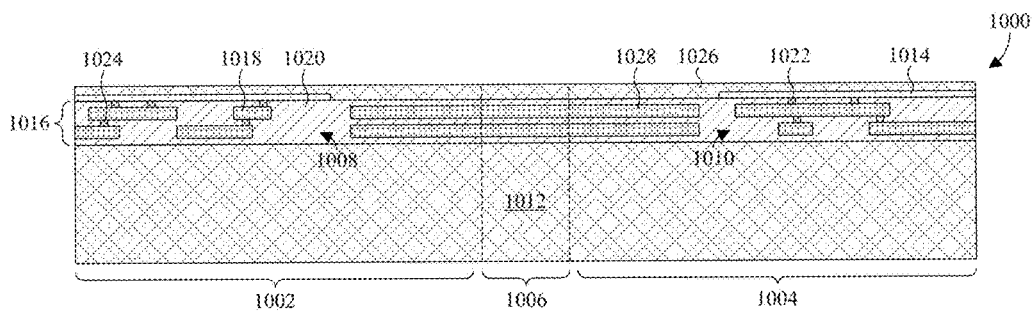
FIGS. 10-28 illustrate a series of cross-sectional and top views of some embodiments of image sensor chip at various stages of manufacture, the image sensor chip having a sidewall interconnect structure.

FIG. 10 illustrates a cross-sectional view 1000 of some embodiments corresponding to Action 802.

As shown by FIG. 10, a semiconductor structure having a first image sensor die 1002 and a second image sensor die 1004 is provided. The first and second image sensor die 1002, 1004 correspond to non-overlapping regions of the semiconductor structure, and are spaced with a scribe line 1006 arranged between the first and second image sensor die 1002, 1004. The first and second image sensor die 1002, 1004 include corresponding ICs 1008, 1010 for sensing and/or measuring light incident on the first and second image sensor die 1002, 1004. The ICs 1008, 1010 correspond to, for example, CCD devices, CMOS devices, or BSI devices.

Arranged over and/or within a first substrate 1012, a device layer 1014 and a BEOL metallization stack 1016 collectively form the ICs 1008, 1010. The first substrate 1012 is, for example, a bulk semiconductor substrate of silicon, germanium, or group III and group V elements. Alternatively, the first substrate 1012 is, for example, a SOI substrate. The device layer 1014 includes electronic devices, such as transistors, resistors, capacitors, photodiodes, etc. The BEOL metallization stack 1016 interconnects the electronic devices by one or more metallization layers 1018 arranged within an interlayer ILD layer 1020. One or more contacts 1022 electrically couple the device layer 1014 to the metallization layers 1018, and one or more vias 1024 electrically couple the metallization layers 1018 to each other.

In some embodiments, the device layer 1014 is arranged over the BEOL metallization stack 1016 on a bottom surface of and/or within a second substrate 1026. In other embodiments, the second substrate 1026 is omitted and the device layer 1014 is arranged below the BEOL metallization stack 1016 on a top surface of and/or within the first substrate 1012. The second substrate 1026 is, for example, a bulk semiconductor substrate of silicon, germanium, or group III and group V elements. Alternatively, the second substrate 1026 is, for example, a SOI substrate.

Image sensor bond pads 1028 are arranged within the ILD layer 1020 between the first and second image sensor die 1002, 1004. The image sensor bond pads 1028 are electrically coupled to the device layer 1014 through the BEOL metallization stack 1016 to facilitate external connection of the first and second image sensor die 1002, 1004 to external devices. The first and second image sensor die 1002, 1004 include corresponding, non-overlapping regions of the image sensor bonds pads 1028 separated by the scribe line 1006.

Figure 11:
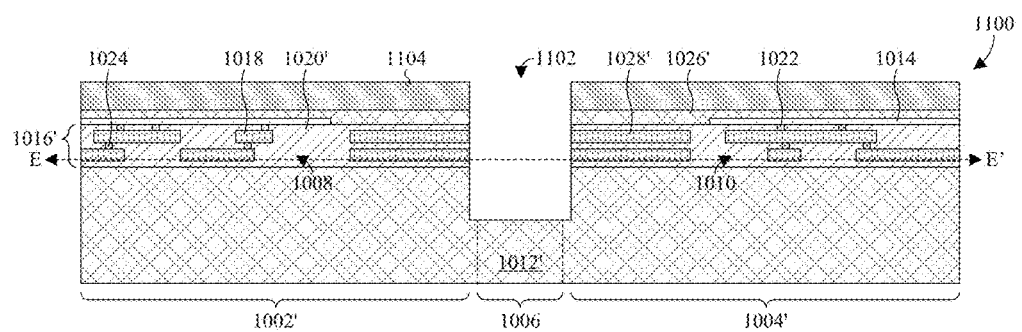
Figure 12:
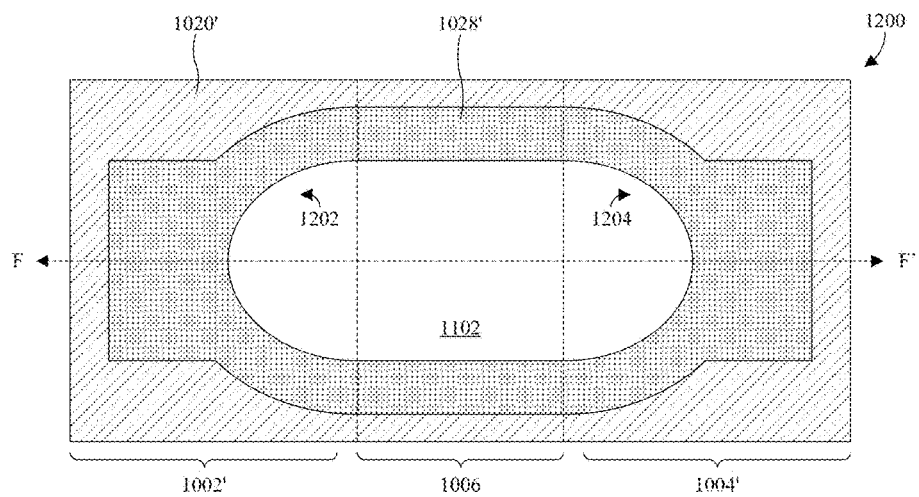

FIGS. 11 and 12 illustrate cross-sectional and top views 1100, 1200 of some embodiments corresponding to Action 804. FIG. 12 is taken along line E-E' of FIG. 11, and FIG. 11 is taken along line F-F' of FIG. 12.

As shown by FIGS. 11 and 12, a first etch is performed through select regions of the second substrate 1026, the BEOL metallization stack 1016, the ILD layer 1020, and the image sensor bond pad regions, and into select regions of the first substrate 1012, to form an opening 1102 between the first and second image sensor die 1002, 1004. In some embodiments, as illustrated in FIG. 12, the first etch also forms concave recesses 1202, 1204 laterally arcing into the image sensor bond pad regions of the remaining first and second image sensor die 1002', 1004'. The process for the first etch includes, for example, forming a first photoresist layer over a top surface of the second substrate 1026 or the BEOL metallization stack 1016, patterning the first photoresist layer, applying an etchant to the second substrate 1026 or the BEOL metallization stack 1016 to selectively etch areas of the second substrate 1026 or the BEOL metallization stack 1016 that are not masked by the patterned first photoresist layer 1104, and removing the patterned first photoresist layer 1104.

Figure 13:
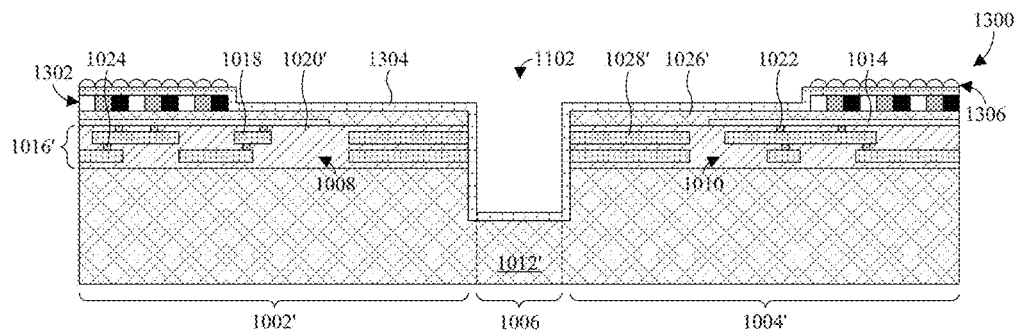

FIG. 13 illustrates a cross-sectional view 1300 of some embodiments corresponding to Actions 806, 808, and 810.

As shown by FIG. 13, color filter arrays 1302 corresponding to the remaining first and second image sensor die 1002', 1004' are formed or otherwise arranged over sensing regions of the corresponding remaining image sensor die 1002', 1004'. In some embodiments, the color filter arrays 1302 are formed or otherwise arranged on the remaining second substrate 1026'. In other embodiments, the color filter arrays 1302 are formed or otherwise arranged on the remaining BEOL metallization stack 1016' or the remaining ILD layer 1020'. The color filter arrays 1302 are, for example, Bayer filters.

Also shown by FIG. 13, a flatness layer 1304 is formed over the color filter arrays 1302 and lining the opening 1102. By lining the opening 1102, sidewalls of the remaining image sensor bond pads 1028', the remaining first and second substrate 1012', 1026', the remaining BEOL metallization stack 1016', and the remaining ILD layer 1020' are lined. The flatness layer 1304 is transparent and smooths the top surfaces of the color filter arrays 1302 to reduce surface roughness of the color filter arrays 1302. In some embodiments, the flatness layer 1304 is or otherwise includes, for example, silicon oxide or aluminum oxide, and may be deposited by way of a physical vapor deposition technique (e.g., CVD, PE-CVD, PVD, etc.).

Also shown by FIG. 13, micro lens arrays 1306 corresponding to the remaining first and second image sensor die 1002', 1004' are formed or otherwise arranged over the color filter arrays 1302 and the flatness layer 1304. The micro lens arrays 1306 focus light through the flatness layer 1304 and the color filter arrays 1302 to the device layer 1014 for sensing by the ICs 1008, 1010.

Figure 14:
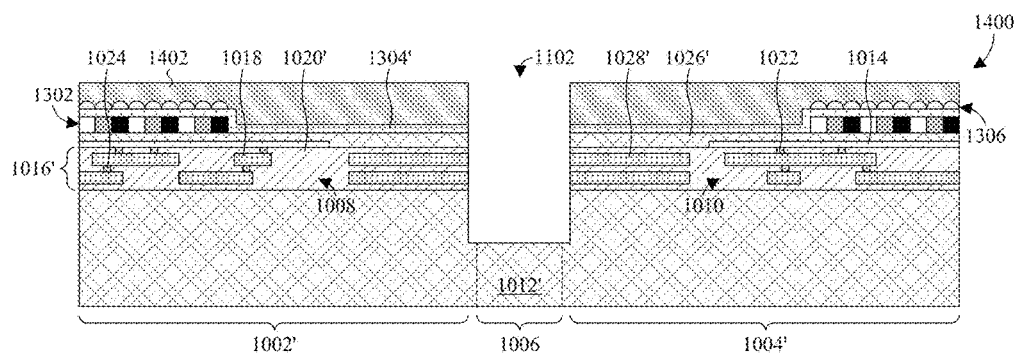

FIG. 14 illustrates a cross-sectional view 1400 of some embodiments corresponding to Action 812.

As shown by FIG. 14, a second etch is performed through selection regions of the flatness layer 1304 to remove regions of the flatness layer 1304 lining sidewalls of the opening 1102. The second etch can be performed by any suitable etching technique, including dry etching and laser etching. In some embodiments, the process for the second etch includes forming a second photoresist layer over a top surface of the flatness layer 1304, patterning the second photoresist layer, applying an etchant to the flatness layer 1304 in areas not masked by the patterned second photoresist layer 1402, and removing the patterned second photoresist layer 1402.

Figure 15:
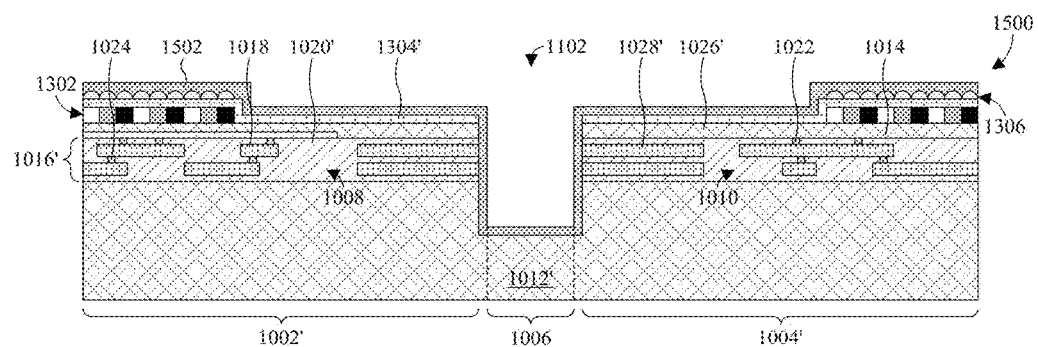
Figure 16:
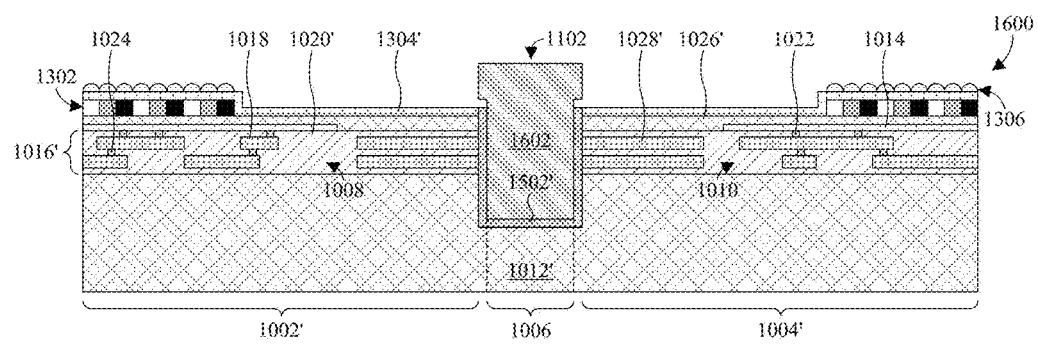

FIGS. 15 and 16 illustrate cross-sectional views 1500, 1600 of some embodiments corresponding to Action 814.

As shown by FIG. 15, a conductive layer 1502 is formed over the remaining flatness layer 1304' and lining the opening 1102. By lining the opening 1102, the conductive layer 1502 abuts the exposed sidewalls of the remaining image sensor bond pads 1028'. In some embodiments, the conductive layer 1502 has concave recesses laterally arcing into the image sensor bond pad regions of the remaining first and second image sensor die 1002', 1004'. The conductive layer 1502 is or otherwise includes, for example, copper, aluminum, tungsten, or aluminum copper.

As shown by FIG. 16, a third etch is performed through select regions of the conductive layer 1502 surrounding the opening 1102 to remove these regions. In some embodiments, the process for the third etch includes forming a third photoresist layer over a top surface of the conductive layer 1502, patterning the third photoresist layer, applying an etchant to the conductive layer 1502 in areas not masked by the patterned third photoresist layer 1602, and removing the patterned third photoresist layer 1602.

Figure 17:
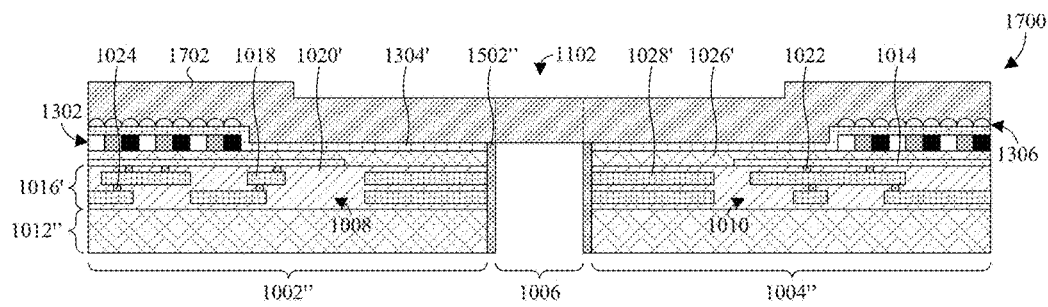

FIG. 17 illustrates a cross-sectional view 1700 of some embodiments corresponding to Action 816.

As shown by FIG. 17, tape 1702 is formed or otherwise arranged over the micro lens arrays 1306, the remaining flatness and conductive layers 1304', 1502', and the opening 1102. Further, with the tape 1702 formed or otherwise arranged, a planarization is performed into the remaining first substrate 1012' to reduce the thickness of the remaining first substrate 1012' and to expose the opening 1102. In some embodiments, the planarization is also performed into regions of the remaining conductive layer 1502' lining the opening 1102. The planarization can, for example, be performed using a chemical-mechanical planarization or polishing (CMP).

Figure 18:
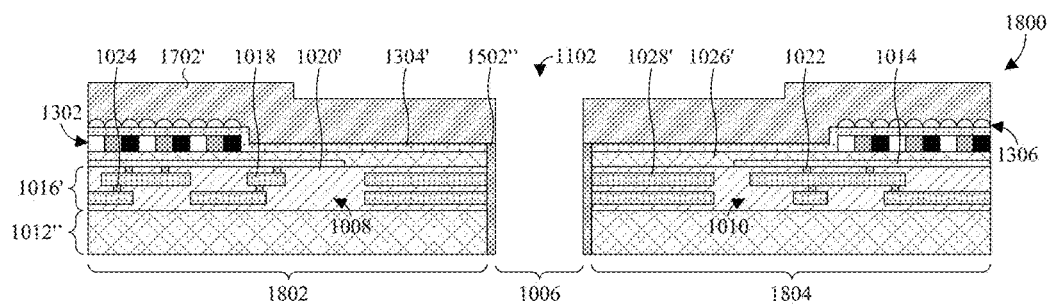

FIG. 18 illustrates a cross-sectional view 1800 of some embodiments corresponding to Action 818.

As shown by FIG. 18, the remaining first and second image sensor die 1002", 1004" are separated. In some embodiments, the separation is performed by moving a die saw along the scribe line 1006 into the tape 1702 and/or through the tape 1702 and the semiconductor structure. The separation forms first and second image sensor chips 1802, 1804 correspondingly including the remaining first and second image sensor die 1002", 1004" and sidewall interconnect structures 1806 along the sidewalls of the remaining first and second image sensor die 1002", 1004". The sidewalls interconnect structures 1806 are formed from the remaining conductive layer 1502" and provide an external structure for bonding and/or electrically coupling the first and second image sensor chips 1802, 1804 to an external device.

Subsequent to the separation, the remaining tape 1702' can be removed and the first and second image sensor chips 1802, 1804 can be packaged. For example, the first and second image sensor chips 1802, 1804 can be soldered and/or GSBed to a package substrate and/or to an external device.

With reference to FIGS. 19-28, cross-sectional views of some embodiments of an image sensor chip at various stages of manufacture are provided to illustrate the method of FIG. 9. Although FIGS. 19-28 are described in relation to the method, it will be appreciated that the structures disclosed in FIGS. 19-28 are not limited to the method, but instead may stand alone as structures independent of the method. Similarly, although the method is described in relation to FIGS. 19-28, it will be appreciated that the method is not limited to the structures disclosed in FIGS. 19-28, but instead may stand alone independent of the structures disclosed in FIGS. 19-28.

Figure 19:
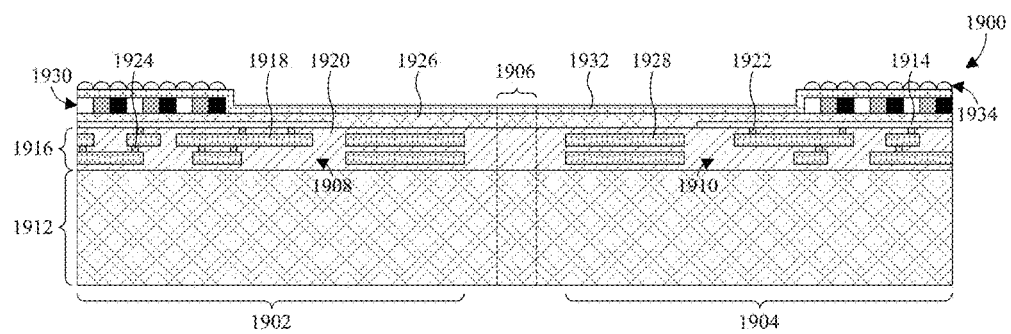

FIG. 19 illustrates a cross-sectional view 1900 of some embodiments corresponding to Actions 902, 904, 906 and 908.

As shown by FIG. 19, a semiconductor structure having a first image sensor die 1902 and a second image sensor die 1904 is provided. The first and second image sensor die 1902, 1904 correspond to non-overlapping regions of the semiconductor structure, and are spaced with a scribe line 1906 arranged between the first and second image sensor die 1902, 1904. The first and second image sensor die 1902, 1904 include corresponding ICs 1908, 1910 for sensing and/or measuring light incident on the first and second image sensor die 1902, 1904. The ICs 1908, 1910 correspond to, for example, CCD devices, CMOS devices, or BSI devices.

Arranged over and/or within a first substrate 1912, a device layer 1914 and a BEOL metallization stack 1916 collectively form the ICs 1908, 1910. The first substrate 1912 is, for example, a bulk semiconductor substrate of silicon, germanium, or group III and group V elements. Alternatively, the first substrate 1912 is, for example, a SOI substrate. The device layer 1914 includes electronic devices, such as transistors, resistors, capacitors, photodiodes, etc. The BEOL metallization stack 1916 interconnects the electronic devices by one or more metallization layers 1918 arranged within an interlayer ILD layer 1920. One or more contacts 1922 electrically couple the device layer 1914 to the metallization layers 1918, and one or more vias 1924 electrically couple the metallization layers 1918 to each other.

In some embodiments, the device layer 1914 is arranged over the BEOL metallization stack 1916 on a bottom surface of and/or within a second substrate 1926. In other embodiments, the second substrate 1926 is omitted and the device layer 1914 is arranged below the BEOL metallization stack 1916 on a top surface of and/or within the first substrate 1912. The second substrate 1926 is, for example, a bulk semiconductor substrate of silicon, germanium, or group III and group V elements. Alternatively, the second substrate 1926 is, for example, a SOI substrate.

Image sensor bond pads 1928 are arranged within the ILD layer 1920 along the periphery of the first and second image sensor die 1902, 1904. The image sensor bond pads 1928 are electrically coupled to the device layer 1914 through the BEOL metallization stack 1916 to facilitate external connection of the first and second image sensor die 1902, 1904 to external devices.

Also shown by FIG. 19, color filter arrays 1930 corresponding to the first and second image sensor die 1902, 1904 are formed or otherwise arranged over sensing regions of the corresponding image sensor die 1902, 1904. In some embodiments, the color filter arrays 1930 are formed or otherwise arranged on the second substrate 1926. In other embodiments, the color filter arrays 1930 are formed or otherwise arranged on the BEOL metallization stack 1916 or the ILD layer 1920. The color filter arrays 1930 are, for example, Bayer filters.

Also shown by FIG. 19, a flatness layer 1932 is formed over the color filter arrays 1930. In some embodiments, the flatness layer 1932 is also formed over the second substrate 1926 and/or the BEOL metallization stack 1916. The flatness layer 1932 is transparent and smooths the top surfaces of the color filter arrays 1930 to reduce surface roughness of the color filter arrays 1930. The flatness layer 1932 is or otherwise includes, for example, silicon oxide or aluminum oxide.

Also shown by FIG. 19, micro lens arrays 1934 corresponding to the first and second image sensor die 1902, 1904 are formed or otherwise arranged over the color filter arrays 1930 and the flatness layer 1932. The micro lens arrays 1934 focus light through the flatness layer 1932 and the color filter arrays 1930 to the device layer 1914 for sensing by the ICs 1908, 1910.

Figure 20:
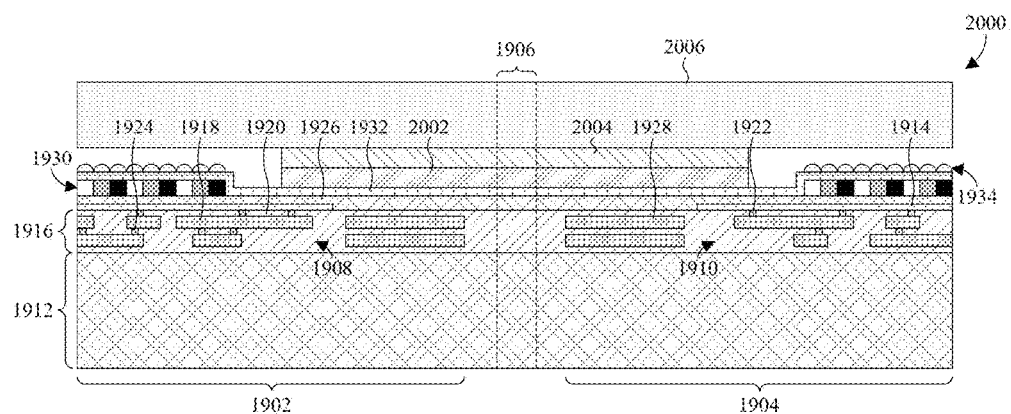

FIG. 20 illustrates a cross-sectional view 2000 of some embodiments corresponding to Actions 910 and 912.

As shown by FIG. 20, an epoxy layer 2002 and a dam layer 2004 are stacked in that order between the micro lens arrays 1934 over one or more of the flatness layer 1932, the second substrate 1926 and the BEOL metallization stack 1916. The epoxy layer 2002 bonds the dam layer 2004 to the first substrate 1912 through, for example, the flatness layer 1932, the second substrate 1926 or the BEOL metallization stack 1916. The dam layer 2004 provides a platform arranged above the micro lens arrays 1934.

Also shown by FIG. 20, a transparent plate 2006, such as a glass plate, is provided and bonded over the dam layer 2004 on the platform. The dam layer 2004 provides spacing between the transparent plate 2006 and the micro lens arrays 1934 to allow the transparent plate 2006 to cover the micro lens arrays 1934.

Figure 21:
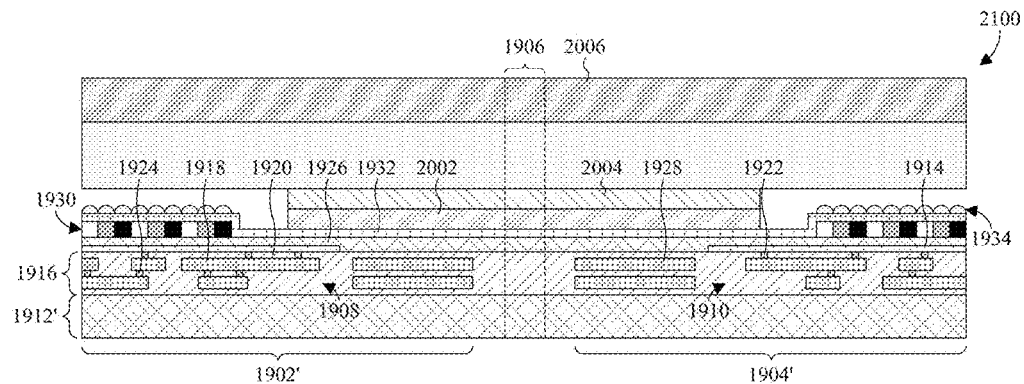

FIG. 21 illustrates a cross-sectional view 2100 of some embodiments corresponding to Action 914.

As shown by FIG. 21, tape 2102 is formed or otherwise arranged over the transparent plate 2006. Further, with the tape 2102 formed or otherwise arranged, a planarization is performed on the first substrate 1912 to reduce the thickness of the first substrate 1912. The planarization can, for example, be performed using a CMP.

Figure 22:
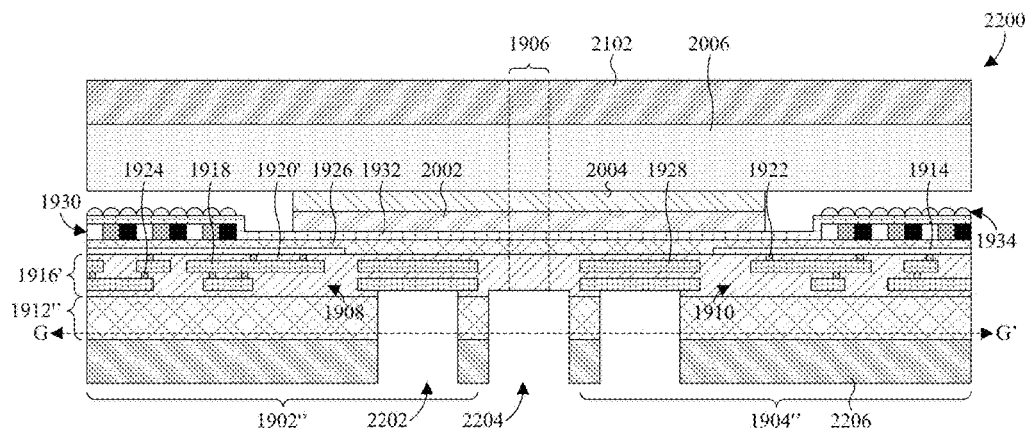
Figure 23:
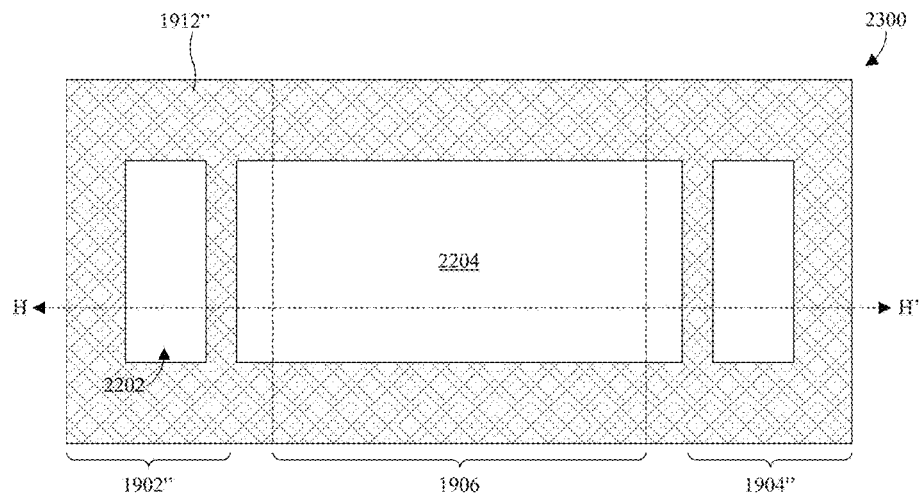

FIGS. 22 and 23 illustrate cross-sectional and top views 2200, 2300 of some embodiments corresponding to Action 916. FIG. 23 is taken along line G-G' of FIG. 22, and FIG. 22 is taken along line H-H' of FIG. 22.

As shown by FIGS. 22 and 23, a first etch is performed through select regions of the remaining first substrate 1912' into the remaining first and second image sensor die 1902', 1904'. The first etch forms TSV holes 2202 extending through the remaining first substrate 1912' to the image sensor bond pads 1928. Further, the first etch forms a sacrificial hole 2204 extending through the remaining first substrate 1912' between the TSV holes 2202 and overlapping with the scribe line 1906. In some embodiments, the first etch is also performed into the BEOL metallization stack 1916 and the ILD layer 1920. The process for the first etch can include forming a first photoresist layer below a bottom surface of the remaining first substrate 1912', patterning the first photoresist layer, applying an etchant to the remaining first substrate 1912' in areas not masked by the patterned first photoresist layer 2206, and removing the patterned first photoresist layer 2206.

Figure 24:
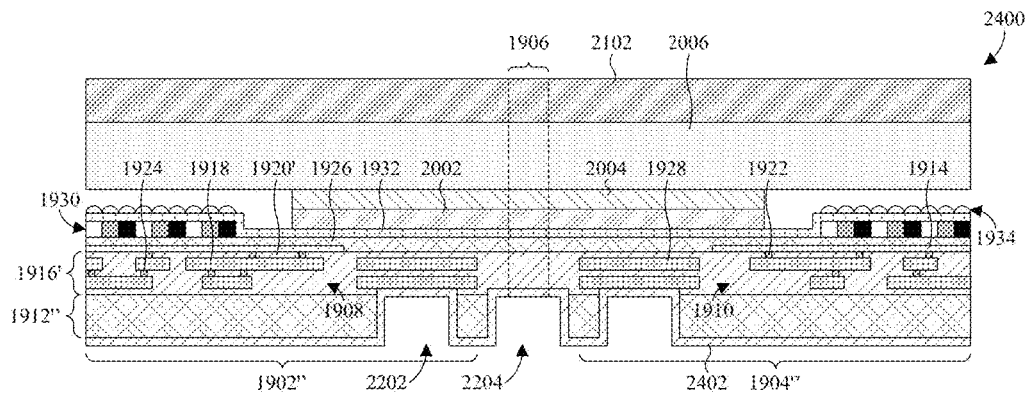
Figure 25:
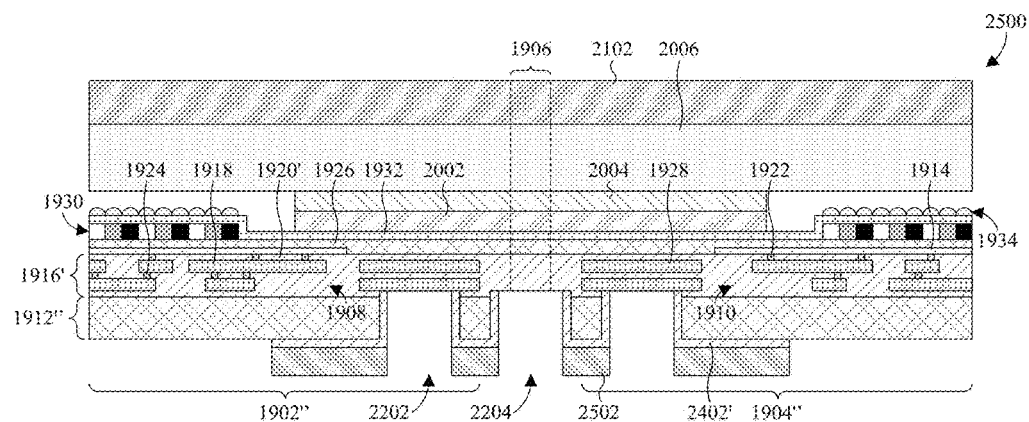

FIGS. 24 and 25 illustrate cross-sectional views 2400, 2500 of some embodiments corresponding to Action 918.

As shown by FIG. 24, a dielectric layer 2402 is formed below the remaining first and second image sensor die 1902", 1904" and below the remaining first substrate 1912'. The dielectric layer 2402 lines the TSV and sacrificial holes 2202, 2204, including regions of the remaining BEOL metallization stack 1916' and the remaining ILD layer 1920' within the TSV and sacrificial holes 2202, 2204. The dielectric layer 2402 is or otherwise includes, for example, silicon dioxide, silicon nitride, or silicon oxynitride.

As shown by FIG. 25, a second etch is performed through select regions of the dielectric layer 2402 to remove regions of the dielectric layer 2402 covering the image sensor bond pads 1928 in the TSV holes 2202. In some embodiments, the second etch further removes regions of the dielectric layer 2402 covering the remaining ILD layer 1920' and/or the remaining BEOL metallization stack 1916' in the sacrificial hole 2204. Further, in some embodiments, the second etch further removes regions of the dielectric layer 2402 surrounding the TSV and sacrificial holes 2202, 2204. The process for the second etch can include forming a second photoresist layer below a bottom surface of the dielectric layer 2402, patterning the second photoresist layer, applying an etchant to the dielectric layer 2402 in areas not masked by the patterned second photoresist layer 2502, and removing the patterned second photoresist layer 2502.

Figure 26:
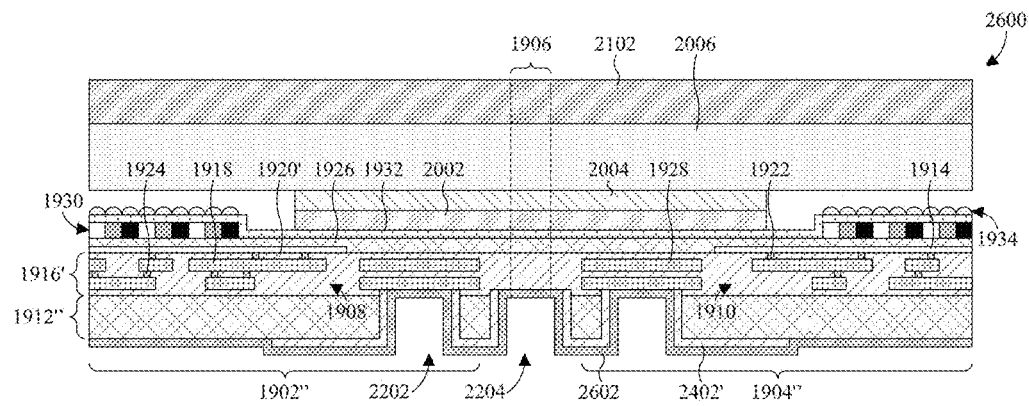
Figure 27:
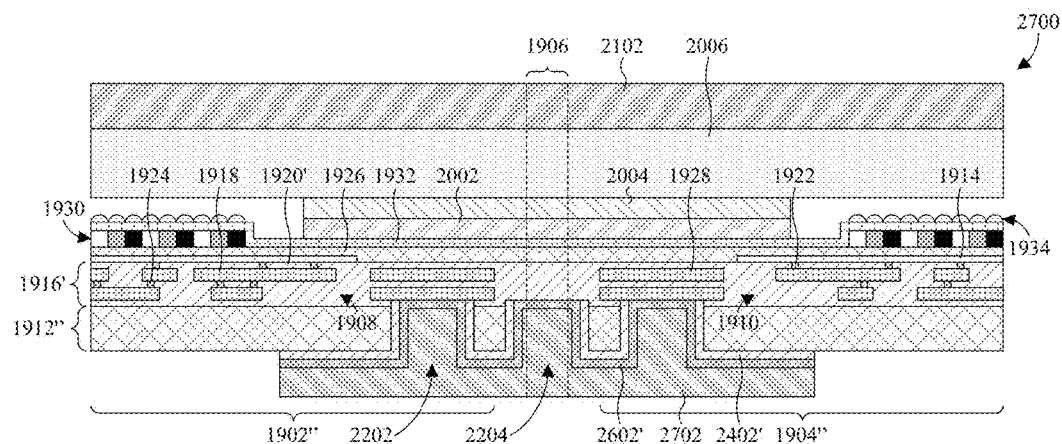

FIGS. 26 and 27 illustrate cross-sectional views 2600, 2700 of some embodiments corresponding to Action 920.

As shown by FIG. 26, a conductive layer 2602 is formed below the remaining dielectric layer 2402' and lining the TSV and sacrificial holes 2202, 2204. Further, the conductive layer 2602 extends continuously between the TSV holes 2202 and the sacrificial holes 2204. By lining the TSV and sacrificial holes 2202, 2204, the conductive layer 2602 abuts the exposed surfaces of the image sensor bond pads 1928 and electrically couples regions of the conductive layer 2602 within the sacrificial holes 2204 to the image sensor bond pads 1928. The conductive layer 2602 is or otherwise includes, for example, copper, aluminum, tungsten, or aluminum copper.

As shown by FIG. 27, a third etch is performed through select regions of the conductive layer 2602 to remove regions of the conductive layer 2602 surrounding the TSV and sacrificial holes 2202, 2204, while leaving regions of the conductive layer 2602 extending between TSV holes 2202 and the sacrificial hole 2204. In some embodiments, the process for the third etch includes forming a third photoresist layer below a bottom surface of the conductive layer 2602, patterning the third photoresist layer, applying an etchant the conductive layer 2602 in areas not masked by the patterned third photoresist layer 2702, and removing the patterned third photoresist layer 2702.

Figure 28:
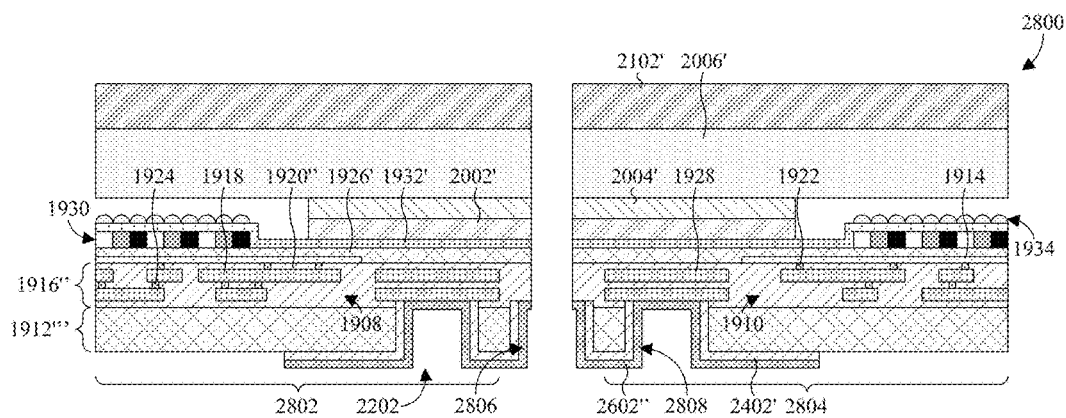

FIG. 28 illustrates a cross-sectional view 2800 of some embodiments corresponding to Action 922.

As shown by FIG. 28, the remaining first and second image sensor die 1902", 1904" are separated. In some embodiments, the separation is performed by moving a die saw along the scribe line 1906 into and/or through the tape 2102, and through the transparent plate 2006, the dam layer 2004, the epoxy layer 2002, the flatness layer 1932, the second substrate 1926, the remaining BEOL metallization stack 1916', the remaining ILD layer 1920', and the remaining conductive layer 2602'.

The separation forms first and second image sensor chips 2802, 2804 correspondingly including the remaining first and second image sensor die 1902", 1904" and sidewall interconnect structures 2806. For example, the remaining first and second image sensor die 1902", 1904" and the sidewall interconnect structures 2806 include corresponding regions of the remaining transparent plate 2006', the remaining dam layer 2004', the remaining epoxy layer 2002', the remaining flatness layer 1932', the remaining second substrate 1926', the remaining BEOL metallization stack 1916", the remaining ILD layer 1920", and the remaining conductive layer 2602". The sidewall interconnect structures 2806 are arranged along the sidewalls of the remaining first and second die 1902", 1904" and electrically coupled to corresponding TSVs 2808. The sidewalls interconnect structures 2806 and the TSVs 2808 are formed from the remaining conductive layer 2602" and provide an external structure for bonding and/or electrically coupling the first and second image sensor chips 2802, 2804 to an external device.

Subsequent to the separation, the remaining tape 2102' can be removed, and the first and second image sensor chips 2802, 2804 can be packaged. For example, the first and second image sensor chips 2802, 2804 can be soldered and/or GSBed to a package substrate and/or to an external device.

Thus, in some embodiments, the present disclosure provides an image sensor chip. A substrate supports an integrated circuit IC configured to sense incident light. A sidewall interconnect structure is arranged along a sidewall of the substrate and electrically coupled with the IC.

In other embodiments, the present disclosure provides a method for manufacturing an image sensor chip. An image sensor die is provided having a substrate supporting an IC for sensing incident light. A sidewall interconnect structure is formed along a sidewall of the substrate and in electrical communication with the IC.

In yet other embodiments, the present disclosure provides an image sensor package. A package substrate has a package bond pad. An image sensor chip is arranged over the package substrate. The image sensor chip includes an IC electrically coupled with a sidewall interconnect structure arranged along a sidewall of the image sensor chip. An electrical coupling structure is arranged over the package bond pad along the sidewall of the image sensor chip. The electrical coupling structure is configured to electrically couple the IC to the package bond pad through the sidewall interconnect structure.

In yet other embodiments, the present disclosure provides an IC chip. A BEOL metallization stack underlies a semiconductor substrate. The BEOL metallization stack comprises an ILD layer, and further comprises metallization layers and a contact layer stacked in the ILD layer. The metallization layers comprise a bond pad. A conductive sidewall structure lines sidewalls respectively of the semiconductor substrate, the ILD layer, and the bond pad. The sidewalls are substantially even. Further, the conductive sidewall structure laterally contacts the bond pad and has a line-shaped profile.

In yet other embodiments, the present disclosure provides another IC chip. An ILD layer is under a first semiconductor substrate. A stack of conductive features is within the ILD layer. The conductive features comprise vias, contacts, and lines, and further comprise a bond pad having a sidewall arcing laterally into the ILD layer. A second semiconductor substrate is under the ILD layer. A top surface of the ILD layer and a bottom surface of the ILD layer respectively contact the first semiconductor substrate and the second semiconductor substrate. A conductive sidewall layer lines and contacts sidewalls respectively of the first and second semiconductor substrates and the ILD layer, and further lines and contacts the sidewall of the bond pad.

In yet other embodiments, the present disclosure provides another IC package. An IC chip comprises a semiconductor substrate and a BEOL interconnect structure underlying the semiconductor substrate. The BEOL interconnect structure comprises an ILD layer, and further comprises conductive features stacked in the ILD layer. The conductive features comprise a bond pad. A conductive sidewall structure is along a sidewall of the IC chip. The conductive sidewall structure laterally contacts the bond pad and has a line-shaped profile. The line-shaped profile has a bottom surface even with a bottom surface of the IC chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip comprising:
a semiconductor substrate;
a back-end-of-line (BEOL) metallization stack underlying the semiconductor substrate, wherein the BEOL metallization stack comprises an interlayer dielectric (ILD) layer, and further comprises metallization layers and a contact layer stacked in the ILD layer, wherein the metallization layers comprise a bond pad; and
a conductive sidewall structure lining sidewalls respectively of the semiconductor substrate, the ILD layer, and the bond pad, wherein the sidewalls are substantially even, and wherein the conductive sidewall structure laterally contacts the bond pad and has a line-shaped profile.

2. The IC chip according to claim 1, further comprising:
a device layer on an underside of the semiconductor substrate, between the semiconductor substrate and the BEOL metallization stack, wherein the device layer is electrically coupled to the bond pad through the contact layer.

3. The IC chip according to claim 1, further comprising:
a second semiconductor substrate underlying the BEOL metallization stack, wherein the conductive sidewall structure lines a sidewall of the second semiconductor substrate that is even with the sidewalls respectively of the semiconductor substrate, the ILD layer, and the bond pad.

4. The IC chip according to claim 3, wherein the semiconductor substrate and the second semiconductor substrate contact the ILD layer.

5. The IC chip according to claim 3, wherein the conductive sidewall structure has a bottom surface that is even with a bottom surface of the second semiconductor substrate.

6. The IC chip according to claim 5, further comprising:
a flattening layer covering the semiconductor substrate, wherein the conductive sidewall structure has a top surface that is even with an upper surface of the flattening layer.

7. The IC chip according to claim 6, wherein the top surface of the conductive sidewall structure and the bottom surface of the conductive sidewall structure are respectively at a top surface of the line-shaped profile and a bottom surface of the line-shaped profile.

8. The IC chip according to claim 6, further comprising:
an array of color filters covering the semiconductor substrate, wherein the flattening layer covers the array of color filters and lines sidewalls of the array.

9. The IC chip according to claim 1, wherein the conductive sidewall structure arcs laterally into the semiconductor substrate and conforms to the bond pad.

10. An integrated circuit (IC) chip comprising:
a first semiconductor substrate;
an interlayer dielectric (ILD) layer under the first semiconductor substrate;
an stack of conductive features within the ILD layer, wherein the conductive features comprise vias, contacts, and lines, and wherein the conductive features further comprise a bond pad having a sidewall arcing laterally into the ILD layer;
a second semiconductor substrate under the ILD layer, wherein a top surface of the ILD layer and a bottom surface of the ILD layer respectively contact the first semiconductor substrate and the second semiconductor substrate; and
a conductive sidewall layer lining and contacting sidewalls respectively of the first and second semiconductor substrates and the ILD layer, and further lining and contacting the sidewall of the bond pad.

11. The IC chip according to claim 10, further comprising:
a semiconductor device layer in the first semiconductor substrate, between the first semiconductor substrate and the ILD layer, wherein the conductive features are electrically coupled to the semiconductor device layer, and wherein the conductive sidewall layer is electrically coupled to the device layer through the conductive features.

12. The IC chip according to claim 10, wherein the IC chip further comprises:
an array of color filters over the first semiconductor substrate; and
a dielectric layer covering the first semiconductor substrate and the array of color filters, and further lining sidewalls of the array of color filters;
wherein the conductive sidewall layer has a top surface that is even with an upper surface of the dielectric layer, and wherein the conductive sidewall layer has a bottom surface that is even with a bottom surface of the second semiconductor substrate.

13. The IC chip according to claim 12, further comprising:
an array of micro lenses covering the array of color filters over the dielectric layer.

14. The IC chip according to claim 10, wherein the conductive sidewall layer has substantially uniform thickness from top to bottom.

15. The IC chip according to claim 10, wherein the conductive features further comprise a second bond pad overlapping the bond pad, and wherein the conductive sidewall layer lines and contacts a sidewall of the second bond pad.

16. The IC chip according to claim 15, wherein the sidewall of the second bond pad is aligned to the sidewall of the bond pad.

17. The IC chip according to claim 10, wherein the conductive sidewall layer has a line-shaped profile, and wherein a top surface of the conductive sidewall layer and a bottom surface of the conductive sidewall layer are respectively at opposite ends of the line-shaped profile, and wherein the bottom surface of the conductive sidewall layer is even with a bottom surface of the second semiconductor substrate.

18. The IC chip according to claim 10, wherein the conductive features further comprise a second bond pad having a sidewall arcing laterally into the ILD layer, wherein the bond pad and the second bond pad border different sidewalls of the ILD layer, and wherein the IC chip further comprises a second conductive sidewall layer lining and contacting sidewalls respectively of the first and second semiconductor substrates and the ILD layer, and further lining and contacting the sidewall of the second bond pad.

19. An integrated circuit (IC) package comprising:
an IC chip comprising:
a semiconductor substrate; and
a back-end-of-line (BEOL) interconnect structure underlying the semiconductor substrate, wherein the BEOL interconnect structure comprises an interlayer dielectric (ILD) layer, and further comprises conductive features stacked in the ILD layer, wherein the conductive features comprise a bond pad; and
a conductive sidewall structure along a sidewall of the IC chip, wherein the conductive sidewall structure laterally contacts the bond pad and has a line-shaped profile, and wherein the line-shaped profile has a bottom surface even with a bottom surface of the IC chip.

20. The IC package according to claim 19, further comprising:
a package substrate having a package pad, wherein the bottom surface of the IC chip and the bottom surface of the line-shaped profile contact the package pad; and
a solder ball extending continuously from the package pad to the conductive sidewall structure to electrically couple the package pad and the bond pad together, wherein the conductive sidewall structure laterally spaces the solder ball from the IC chip.

* * * * *